United States Patent

Jun

[11] Patent Number: 5,936,297
[45] Date of Patent: Aug. 10, 1999

[54] PROGRAMMABLE SEMICONDUCTOR ELEMENT HAVING AN ANTIFUSE STRUCTURE

[75] Inventor: Young Kwon Jun, Seoul, Rep. of Korea

[73] Assignee: LG Semicon Co., Ltd., Chungcheongbuk-do, Rep. of Korea

[21] Appl. No.: 08/823,432

[22] Filed: Mar. 24, 1997

Related U.S. Application Data

[62] Division of application No. 08/491,209, Jun. 16, 1995, Pat. No. 5,652,169.

[30] Foreign Application Priority Data

Jun. 16, 1994 [KR] Rep. of Korea ..................... 94-13624

[51] Int. Cl.⁶ .................................................. H01L 29/00
[52] U.S. Cl. ........................... 257/530; 257/50; 438/600; 365/96
[58] Field of Search .............................. 257/50, 209, 530, 257/529; 438/600, 601; 365/96

[56] References Cited

U.S. PATENT DOCUMENTS

| 4,751,197 | 6/1988 | Wills | 437/174 |
|---|---|---|---|
| 4,853,758 | 8/1989 | Fischer | 357/51 |
| 5,019,878 | 5/1991 | Yang et al. | 357/23.3 |
| 5,166,556 | 11/1992 | Hsu et al. | 307/465 |
| 5,365,105 | 11/1994 | Liu et al. | 257/530 |
| 5,416,355 | 5/1995 | Kudoh | 257/529 |
| 5,550,404 | 8/1996 | Yen et al. | 257/530 |
| 5,552,627 | 9/1996 | McCollum et al. | 257/50 |
| 5,585,662 | 12/1996 | Ogawa | 437/922 |
| 5,625,219 | 4/1997 | Takagi | 257/530 |

*Primary Examiner*—Valencia Martin-Wallace
*Attorney, Agent, or Firm*—Loudermilk & Associates

[57] ABSTRACT

A programmable semiconductor element having an antifuse structure is disclosed. A first insulation film is formed on a silicon substrate. First and second conductors are formed on the first insulation film. The first and second conductors are spaced apart at a contact hole region. A second insulation film is formed on the first insulation film and the first and second conductors. The second insulation film includes a contact hole at a portion corresponding to the contact hole region. The second insulation film includes a recess adjacent to the contact hole. A conductor link is formed in the recess in the second insulation film. A third insulation film is formed over the conductor link.

20 Claims, 8 Drawing Sheets

PROGRAMMABLE SEMICONDUCTOR ELEMENT HAVING AN ANTIFUSE STRUCTURE

This is a divisional of application Ser. No. 08/491,209 filed on Jun. 16, 1995 U.S. Pat. No. 5,652,169.

FIELD OF THE INVENTION

This invention relates to semiconductor elements, and more particularly to laser programmable semiconductor elements having an antifuse structure and methods for fabricating the same.

BACKGROUND OF THE INVENTION

Recently, methods for carrying out programming with a laser after fabrication of semiconductor elements, such as memory elements, have been utilized. In selective laser programming methods, there are antifuse-type laser make-link programming, in which two electrically separated conductors are connected to each other using a conductive link, such as a metal, using a laser, and fuse-type laser break-link programming, in which two electrically connected conductors are separated with laser. For example, in case of memory elements, laser break-link programming has been utilized.

When a memory element is found defective upon testing of the memory element after completion of fabrication, a unit cell of the memory element having one or more defective parts is, after identifying the one or more defective parts, replaced with a redundant cell. Then, conductors at the surface of the redundant cell selectively are cut/melted with a laser, thus completing the programming of the redundant cell.

There are various problems with such a laser break-link programming method. For example, the chip should have an increased surface area because of the surface area required for link structures or circuits necessary for the link programming, and also surface damage may result from the programming.

A laser make-link programming method has been suggested, with which the surface area necessary for the link structure can be decreased, and damages to surrounding regions and remainders caused at the time of carrying out laser programming can be prevented.

Such a programming method has been disclosed by Kendal S. Willis in U.S. Pat. No. 4,751,197, in which two conductors are formed with an insulation film between them, with the insulation film broken at a designated part with intensive direction of a laser onto the designated part, thereby connecting the two conductors.

Figure 1:
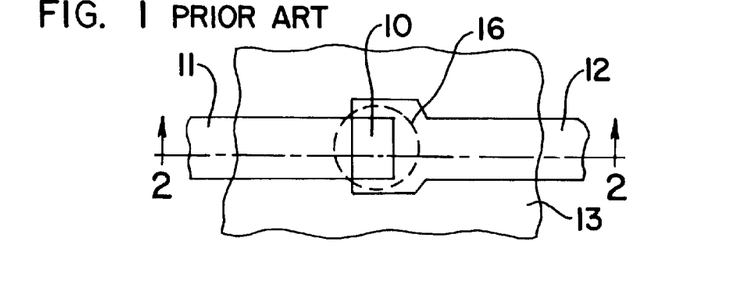
FIG. 1 is a plan view illustrating a conventional programmable semiconductor element having an antifuse structure.
Figure 2:
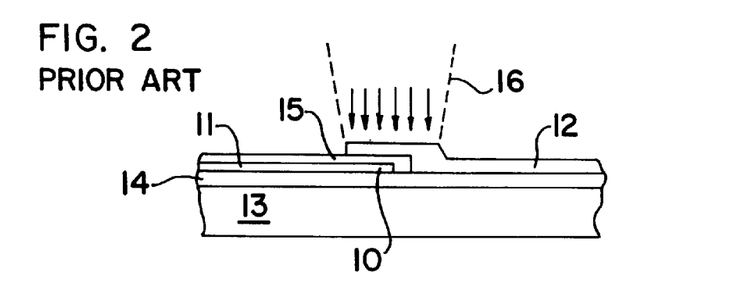
FIG. 2 is a sectional view of the programmable semiconductor element along line 2—2 of FIG. 1.
Figure 3:
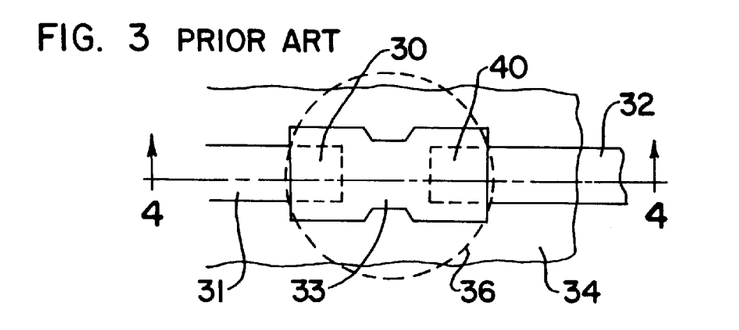
FIG. 3 is a plan view illustrating another conventional programmable semiconductor element having another antifuse structure.
Figure 4:
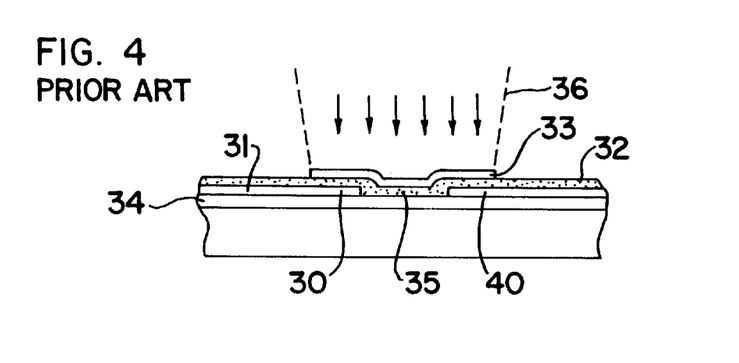
FIG. 4 is a sectional view of the programmable semiconductor element along line 4—4 of FIG. 3.

FIGS. 1 and 3 are enlarged plan views illustrating a part of a conventional programmable semiconductor element having an antifuse structure. FIG. 2 is a sectional view along line 2—2 of FIG. 1, and FIG. 4 is a sectional view along line 4—4 of FIG. 3.

Referring to FIGS. 1 and 2, a conventional programmable semiconductor element having an antifuse structure includes insulation film 14 formed on silicon substrate 13, and two conductors 11 and 12, with insulation film 15 between conductors 11 and 12, formed on insulation film 14. In the drawings, reference number 10 represents a link area formed between conductors 11 and 12 and reference member 16 represents a region to which a laser beam will be directed.

Oxide film 15 formed between conductors 11 and 12 can be broken with laser beam 16 focused onto link area 10 due to the resulting heat, which short circuits conductors 11 and 12, electrically connecting them.

Herein, as for the material of the conductors, tungsten (W), aluminum (Al) or a polysilicon film may be used, and oxide film 15 between conductors 11 and 12 is a thermal oxide film having a thickness of about 200 Angstroms. As for the laser, an argon (Ar) ion laser of 0.488 $\mu$m wave length or an ND:YAG laser of 1.06 $\mu$m wave length can be used, and the size of the laser beam may be 6 $\mu$m.

When the power per pulse is 1 micro joule ($\mu$j), upon direction of the laser for 20 ms, oxide film 15 having 200 Angstroms thickness can be broken, electrically short circuiting conductors 11 and 12. To accelerate the interface reaction, conductors 11 and 12 may have a voltage of 5V to 20V applied thereto, or may be put under hydrogen atmosphere if the material of the conductor is aluminum.

Illustrated in FIGS. 3 and 4 is a programmable semiconductor element having an antifuse structure provided with conductor 33 for linkage formed over two conductors 31 and 32. Oxide film 35 between conductor 33 for linkage and first and second conductors 31 and 32 serves as a layer like oxide film 15 between conductors 11 and 12 of FIGS. 1 and 2.

The semiconductor has first linkage area 30 formed between first conductor 31 and linkage conductor 33, and second linkage area 40 formed between second conductor 32 and linkage conductor 33. Therefore, when laser beam 36 is focused thereon, oxide film 35 of linkage areas 30 and 40 is broken, which short circuits first and second conductors 31 and 32 with linkage conductor 33, connecting first and second conductors 31 and 32, electrically.

Such a programmable semiconductor element having an antifuse structure can have the two conductors connected to each other through linkage conductor 33 even in case a junction between first and second conductors 31 and 32 has not been formed or corrosion has been developed thereon.

However, programmable semiconductor elements having an antifuse structure as illustrated in FIGS. 1 and 3 present certain problems, such as requiring a laser power over a critical level, which is due to the oxide film formed between the conductors in a fixed thickness which is broken in order to short circuit the two conductors by a laser beam directed onto the link areas. In addition, such structures may have a greater contact resistance because the breakage of the oxide film happens not overall but locally, forming non-uniform connections between the conductors.

SUMMARY OF THE INVENTION

Objects of this invention for solving the foregoing problems are to provide a programmable semiconductor element having an antifuse structure which can reduce contact resistance and improve the reliability of the element by forming a uniform connection between the two conductors, and to provide a fabrication method for a programmable semiconductor element having an antifuse structure which can reduce contact resistance and improve the reliability of the element.

These and other objects and features of this invention can be achieved by providing a programmable semiconductor element having an antifuse structure including a silicon substrate, a first insulation film formed on the silicon substrate, a contact hole formed on the first insulation film, two conductors each having a fixed or predetermined width formed on the first insulation film separated from each other, a second insulation film formed on the first insulation film covering the two conductors excluding the contact hole, and having a concave region at the edges adjoining the contact hole, a conductor link formed in the concave region in the second insulation film, and a capping insulation film formed on the overall surface of the substrate covering the conductor link, and by providing a fabrication method for a programmable semiconductor element having an antifuse structure including processes for forming a first insulation film on a silicon substrate, forming a conductive material having a fixed or predetermined width on the first insulation film, forming a second insulation film on the conductive material, forming a recess by etching a part of the second insulation film, forming a conductive link at corners of the recess in the second insulation film, forming a contact hole by etching portions of the second insulation film in the recess thereof having no conductive link formed thereon, exposing the conductive material at a lower part, forming two separated conductors by etching the exposed conductive material, and forming a capping insulation film on all over the surface of the substrate covering the conductive link.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

The detail of this invention is to be explained hereinafter, referring to the attached drawings.

Figure 5:
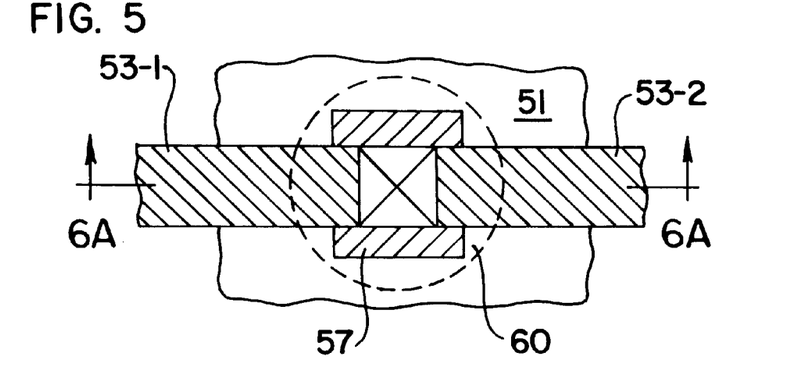
FIG. 5 is a plan view illustrating a programmable semiconductor element having an antifuse structure in accordance with this invention.
Figure 6A:
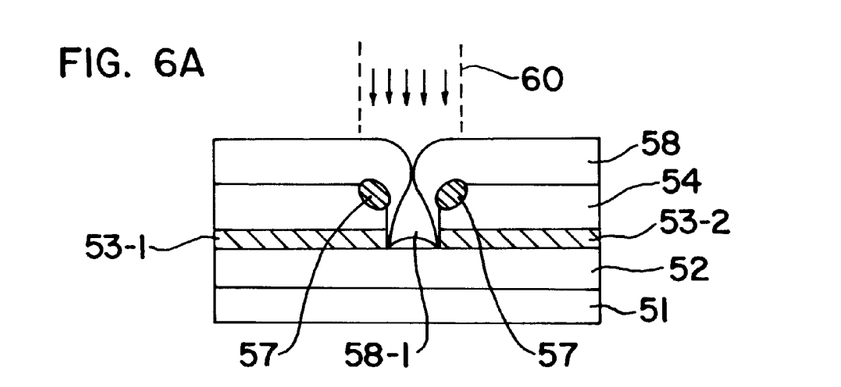
FIGS. 6A and 6B are sectional views along line 6—6 of FIG. 5.
Figure 6B:
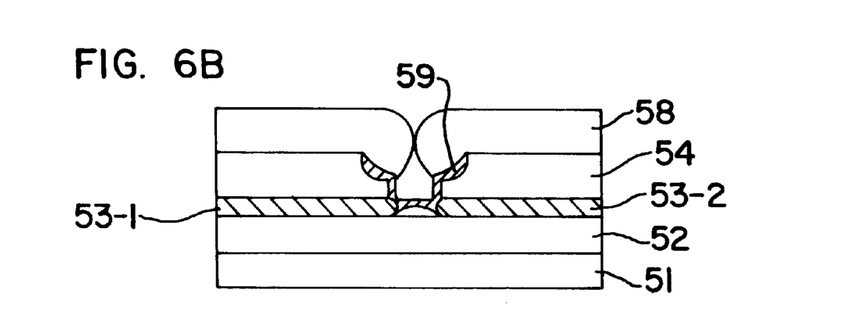

FIG. 5 illustrates a plan view of a programmable semiconductor element having an antifuse structure in accordance with this invention, and FIGS. 6A and 6B are sectional views along line 6—6 FIG. 5.

Referring to FIGS. 5, 6A and 6B, a programmable semiconductor element having an antifuse structure of this invention includes two conductors 53-1 and 53-2 formed on silicon substrate 51 as wiring layers, and square conductive link 57 having an opening formed between conductors 53-1 and 53-2.

Second insulation film 54 is formed between conductors 53-1 and 53-2 and conductor link 57, and first insulation film 52 is formed on substrate 51 under conductors 53-1 and 53-2. Conductive link 57 is formed on concave 54-1 of second insulation film 54 over the two opposite edges of conductors 53-1 and 53-2, and has a square opening at the central part having a width wider than the width of contact hole 55. Accordingly, square conductor link 57 has areas opposite to each other adjoining contact hole 55, one such area over each of the edges of the conductors, and other areas opposite to each other adjoining contact hole 55 but not over any conductors.

Conductive link 57 may be a metal film of aluminum (Al) or an aluminum alloy. First insulation film 52 between conductors 53-1 and 53-2 and substrate 51, and second insulation film 54 between conductors 53-1 and 53-2 and conductive link 57, may be oxide films.

The programmable semiconductor element further has capping insulation film 58 formed on the overall surface of substrate 51 and covering conductive link 57. Accordingly, capping insulation film 58 also is formed inside of contact hole 55 and covers conductive link 57. In this instant, due to the step coverage of the insulation film, which depends on the aspect ratio of the contact hole, insulation film 58-1 formed at the sides of the contact hole is thinner as compared to insulation film 58 formed on second insulation film 54, and the thickness becomes even thinner towards the bottom of the contact hole. For capping insulation film 58, an oxide film or a nitride film may be used.

When pulsed laser beam 60 is directed onto a semiconductor element having the foregoing structure, because the heat capacity of conductive link 57, which is a metal, and capping insulation film 58, which is a nitride or oxide film, are different from each other, the temperature of conductive link 57 having a different heat capacity rises faster, and as a result it is believed that the internal compression stress of the conductive link 57 increases faster as compared with insulation film 58. Accordingly, of capping insulation film 58, relatively thinner insulation film 58-1 formed at the sides of contact hole 55 is broken first.

Therefore, as illustrated in FIG. 6B, conductive link 57, being melted, flows down to the bottom of contact hole 55, which short circuits conductors 53-1 and 53-2, connecting them electrically.

That is, in this invention, because insulation film 58 is not formed in a uniform thickness on the overall surface but instead is formed relatively thinner (film 58-1) at the sides of contact hole 55 due to the step coverage of the insulation film depending on the aspect ratio of the contact hole, insulation film 58-1 at the sides of the contact hole is broken at an earlier time as compared with other portions upon focusing of the laser beam.

Accordingly, since the insulation film can be broken with less laser beam, as well as having a fixed position of breakage, a more uniform connection can be formed.

When conductive link 57 is a metal film such as aluminum or aluminum alloy, and in case the laser is of short wave length, an ArF Eximer laser of 193 nm wave length, $KrF_2$ Eximer laser of 248 nm wave length, XeCl Eximer laser of 308 nm wave length, or a TEA-$CO_2$ laser of 106 nm wave length may be used. In case a short wave length laser is used, an energy intensity of 5 to 12 J/cm$^2$ may be suitable, and the pulse width should be below about 1 μs to prevent damage of the aluminum film used for the conductors.

In case a long wave length is used, an Ar ion laser of 488 nm wave length, or an ND:YAG laser of 1060 nm wave length may be used. In this instant, in case a long wave length laser is used, an energy intensity of 10 to 20 J/cm$^2$ may be suitable, and the pulse width should be below about 1 μs.

Illustrated in FIGS. 7A to 7H are fabrication processes for a programmable semiconductor element having an antifuse structure in accordance with a first embodiment of this invention.

Figure 7A:
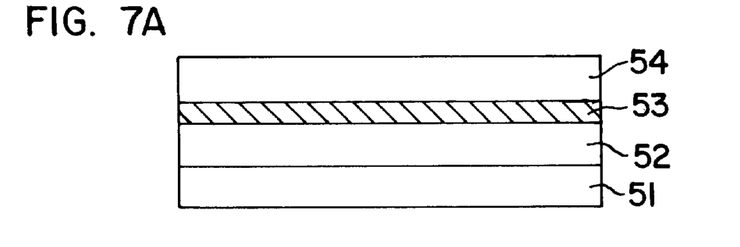
FIGS. 7A to 7H illustrate processes for fabricating a programmable semiconductor element having an antifuse structure in accordance with a first embodiment of this invention.

Referring to FIG. 7A, an oxide film is formed as first insulation film 52 on silicon substrate 51, on which conductive material 53 having a fixed width is formed as a wiring layer. The conductive material may be formed by depositing a metal film such as an aluminum film or aluminum alloy film with a sputtering method or a chemical vapor deposition method to a thickness of about 3000 to 8000 Angstroms, and then patterned. On conductive material 53 an oxide film is formed as second insulation film 54, which may be formed by a chemical vapor deposition method to a thickness of about 5000 to 10,000 Angstroms.

Figure 7B:
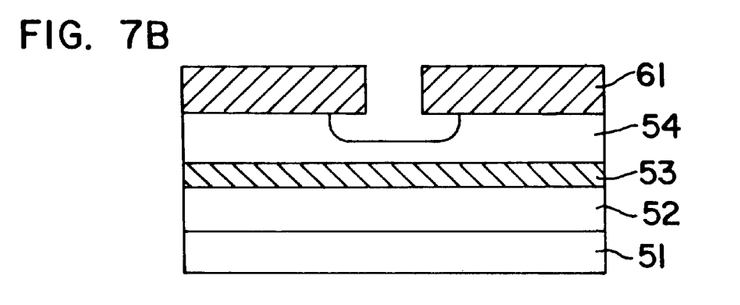

Referring to FIG. 7B, photosensitive film 61 is coated on second insulation film 54, which is subjected to a photoetching, removing photosensitive film 61 from a portion where a contact hole is to be formed. Thus, a portion of second insulation film 54 where the contact hole is to be formed is exposed.

Exposed second insulation film 54 is subjected to a primarily isotropic etching to a certain depth, which may be using a solution containing HF, with the patterned photosensitive film used as a mask.

Figure 7C:
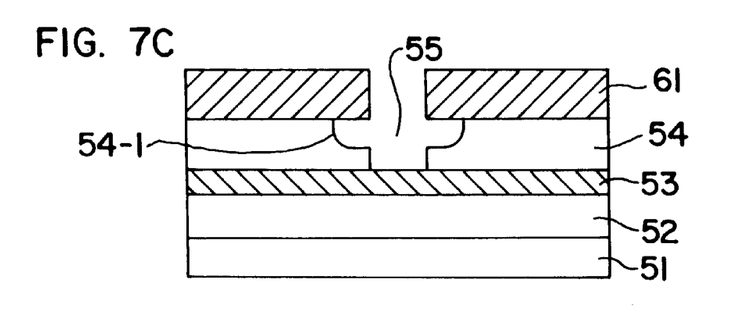

Referring to FIG. 7C, the remaining second insulation film 54 is subjected to an anisotropic etching, which may be under CF$_4$ or CHF$_3$ gas atmosphere, using patterned photosensitive film 61 as a mask, exposing conductive material 53 and forming contact hole 55.

Figure 7D:
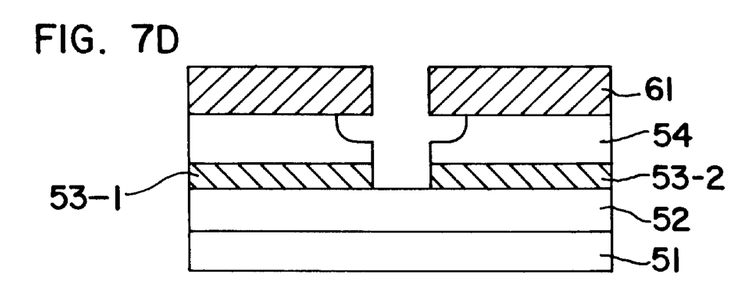

In this instant, a concave region or "concave" 54-1 is formed at the edges of second insulation film 54 adjoining contact hole 55. Referring to FIG. 7D, the exposed conductor 53 is then etched. Thus, separated conductors 53-1 and 53-2 may be formed.

Figure 7E:
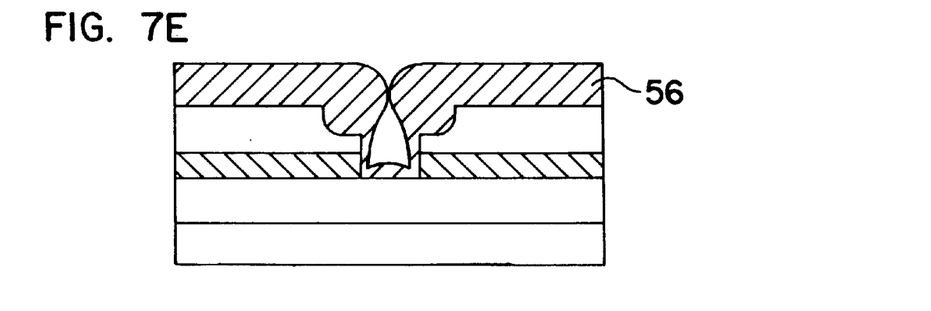

Referring to FIG. 7E, the remaining portions of photosensitive film 61 are removed entirely such as with an alkali solution or O$_2$ ashing.

Conductive material 56, which may be an aluminum film or an aluminum alloy film, is deposited on the overall surface of the substrate such as with a sputtering method to a thickness of about 3000 to 8000 Angstroms.

Figure 7F:
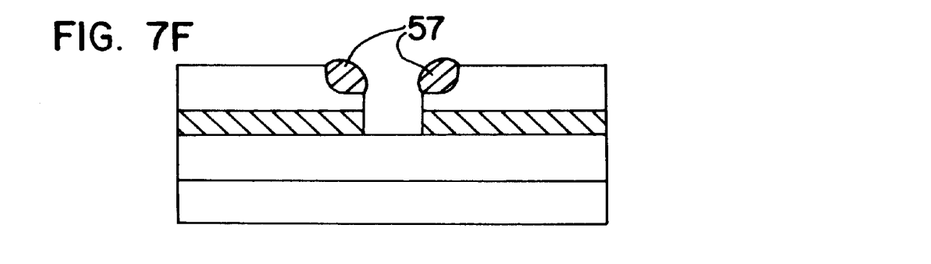

Referring to FIG. 7F, conductive material 56 is subjected to an anisotropic etching using gases such as Cl$_2$ or Br$_2$, leaving the aluminum film or an aluminum alloy film only on concaves 54-1 of second insulation film 54. The remaining aluminum or aluminum alloy film will be conductive link 57 for connecting separated conductors 53-1 and 53-2.

Figure 7G:
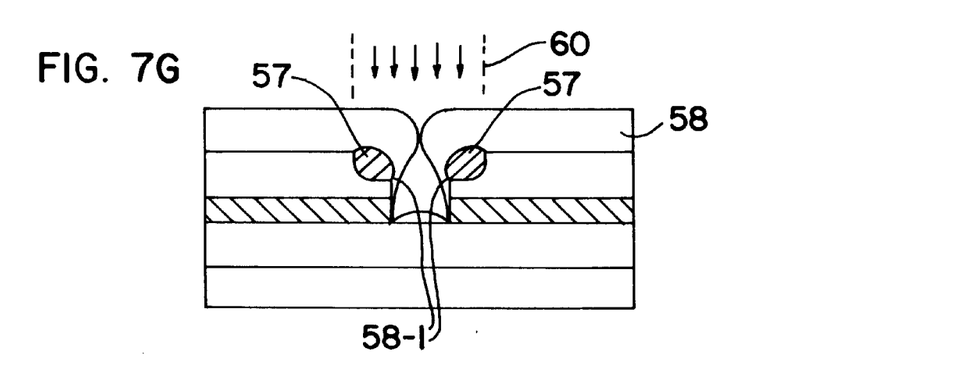

Referring to FIG. 7G, capping insulation film 58 is formed with an oxide film or a nitride film formed on the overall surface of the substrate using a chemical vapor deposition method or a plasma-activated chemical vapor deposition method. In this instant, capping insulation film 58 is formed to be thinner as it approaches the bottom of contact hole 55 in a form surrounding conductive link 57 due to the step coverage of capping insulation film 58, which depends on the aspect ratio of the contact hole. Of capping insulation film 58, the thickness of thin capping insulation film 58-1 formed at the sides of contact hole 55 should be made to be below about 500 Angstroms.

Figure 7H:
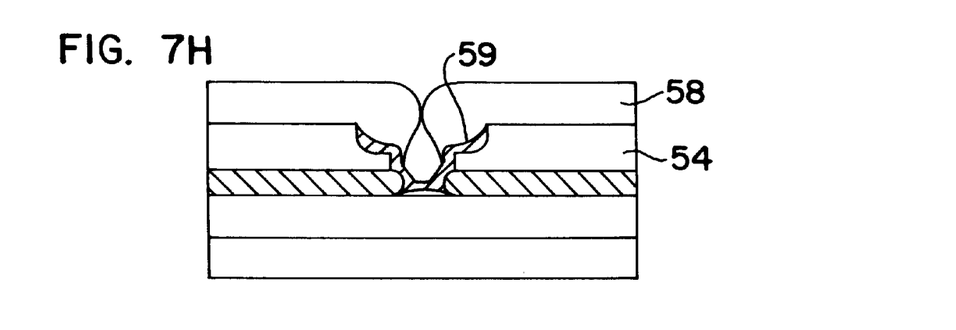

Illustrated in FIG.7H is a state that, on a selective direction of laser beam 60 onto the semiconductor element of FIG. 7G, conductors 53-1 and 53-2 are connected with an aluminum film formed by conductive link 59 melted down at the breakage of thin insulation film 58-1 at a lower portion of contact hole 55.

Illustrated in FIGS. 8A to 8H are fabrication processes for a programmable semiconductor element having an antifuse structure in accordance with a second embodiment of this invention.

Figure 8A:
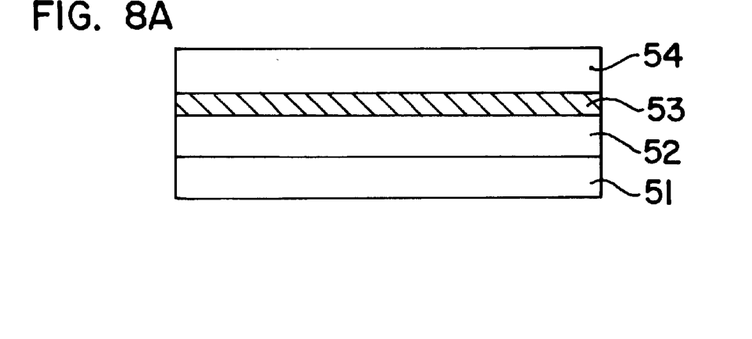
FIGS. 8A to 8H illustrates processes for fabricating a programmable semiconductor element having an antifuse structure in accordance with a second embodiment of this invention.

Referring to FIG. 8A, an oxide film is deposited on silicon substrate 51 as first insulation film 52, on which conductive material 53 is deposited such as with a sputtering or chemical vapor deposition method to a thickness of about 3000 to 8000 Angstroms as a primary wiring layer. Conductive material 53 is a metal layer of a material such as aluminum or an aluminum alloy. An oxide film is deposited on conductive material 53 such as with a chemical vapor deposition method to a thickness of about 5000 to 10,000 Angstroms as an insulation film.

Figure 8B:
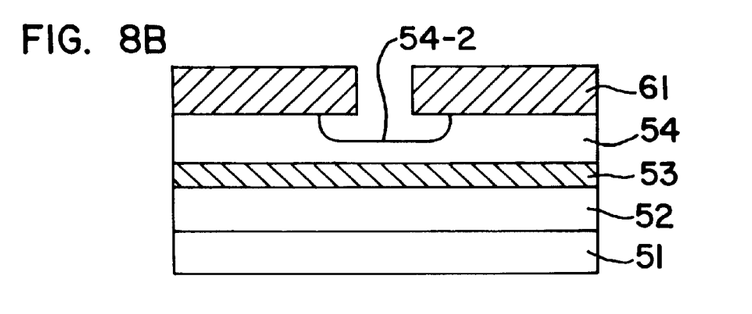

Referring to FIG. 8B, photosensitive film 61 is coated on second insulation film 54, which is subjected to a photoetching process exposing second insulation film 54 on the portion where a contact hole is to be formed. Exposed second insulation film 54 is subjected to an isotropic etching such as in a solution containing HF or gas containing F– ions, using photosensitive film 61 as a mask. Photosensitive film 61 then is removed. In this process, recess 54-2 is formed in the surface of second insulation film 54.

Figure 8C:
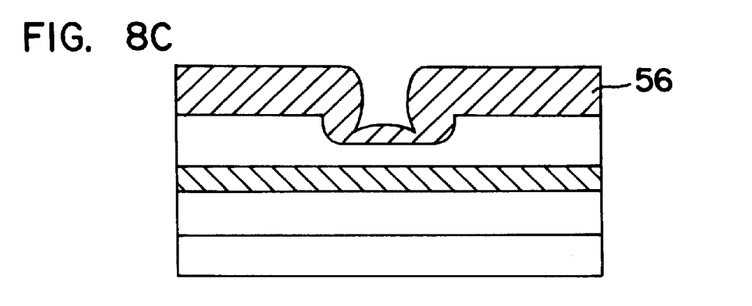

Referring to FIG. 8C, conductive material 56 is deposited on the overall surface of the substrate such as with a sputtering method to a thickness of about 3000 to 8000 Angstroms. Conductive material 56 is a metal film, such as an aluminum film or an aluminum alloy film.

Figure 8D:
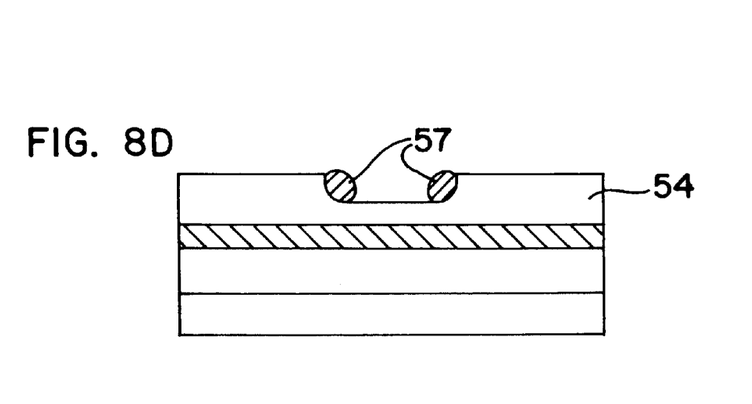

Referring to FIG. 8D, conductive material 56 is subjected to an anisotropic etching with gas, such as C$_2$ forming conductive link 57 in the corners of recess 54-2.

Figure 8E:
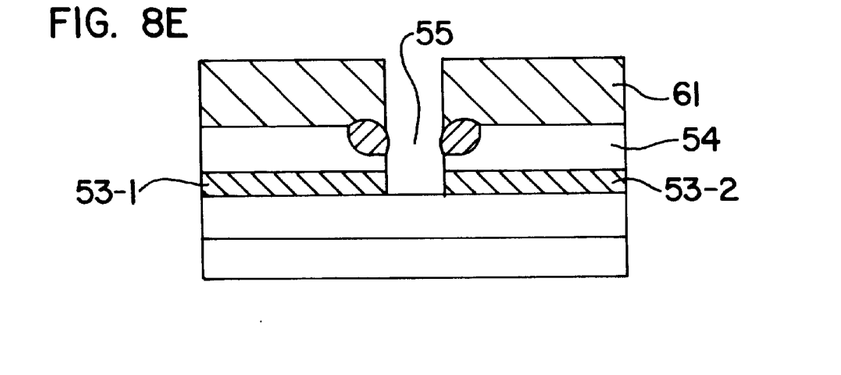

Referring to FIG. 8E, photosensitive film 62 is coated on the overall surface of the substrate, which is subjected to a photoetching exposing recess 54-2 of second insulation film 54, excluding the portion under conductive link 57. Exposed second insulation film 54 at recess 54-2 is subjected to an anisotropic etching in gases, such as CF$_4$ or CHF$_3$, using photosensitive film 62 as a mask, with which contact hole 55 can be formed, with exposed conductive material 53 in contact hole 55. Exposed conductive material 53 is etched using gases, such as Cl$_2$ or Br$_2$, completing formation of contact hole 55.

Through the foregoing processes, conductive material 53 can be divided into two conductors 53-1 and 53-2, and conductive link 57 can be formed on concaves 54-1, previous corners of the recess 54-2, at the edges adjoining contact hole 55.

Figure 8F:
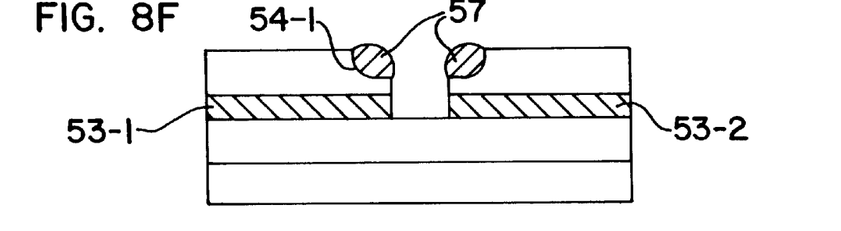

Referring to FIG. 8F, the remained portions of photosensitive 62 film is removed.

Figure 8G:
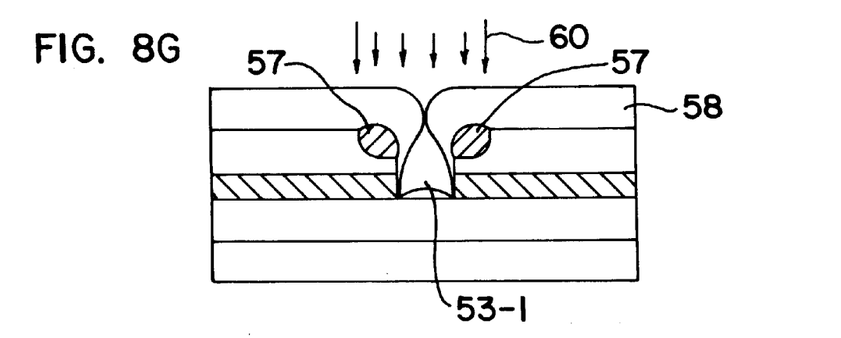

Referring to FIG. 8G, a nitride film or an oxide film is deposited on the overall surface of the substrate forming capping insulation film 58. Capping insulation film 58 is formed thinner toward the bottom of contact hole 55 in a form surrounding conductive link 57 due to the step coverage, which depends on the aspect ratio of contact hole 55. Of capping insulation film 58, the thickness of thin capping insulation film 58-1 formed at the sides of contact hole 55 should be made to be less than about 500 Angstroms.

Figure 8H:
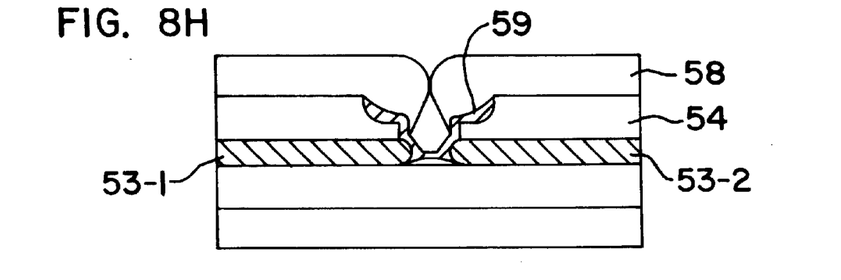

Illustrated in FIG. 8H is a state in which, when laser beam 60 is directed onto the semiconductor layer of FIG. 8G, thin insulation film 58-1 at a lower portion of contact hole 55 has broken, which has led to conductive link 59, melted and flowed down, connecting conductors 53-1 and 53-2.

Illustrated in FIGS. 9A to 9H are processes for fabricating a programmable semiconductor element having an antifuse structure in accordance with a third embodiment of this invention.

The fabrication processes for a programmable semiconductor element having an antifuse structure in accordance with the third embodiment is similar to the fabrication processes in accordance with the second embodiment illustrated in FIGS. 8A to 8H, except that conductive link 57, which is not formed by carrying out etch back of conductive material 56, but instead is formed by carrying out an anisotropic etching of conductive material 56 using a photosensitive film as a mask.

Figure 9A:
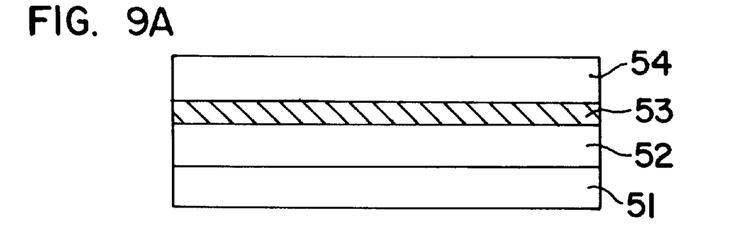
FIGS. 9A to 9H illustrates processes for fabricating a programmable semiconductor element having an antifuse structure in accordance with a third embodiment of this invention.

As illustrated in FIG. 9A, first insulation film 52, conductive material 53 and second insulation film 54 are formed successively on substrate 51.

Figure 9B:
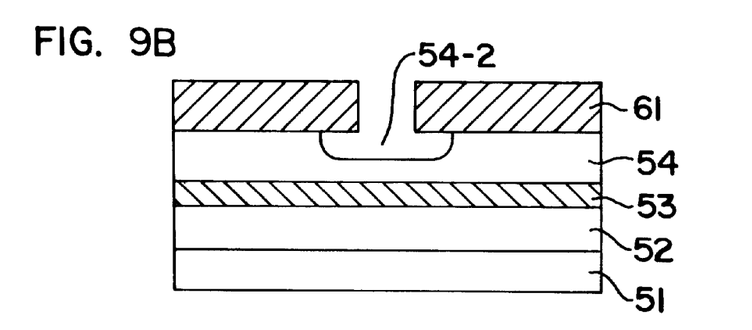

As illustrated in FIG. 9B, second insulation film 54 is subjected to an isotropic etching using photosensitive film 61 as a mask, forming recess 54-2.

Figure 9C:
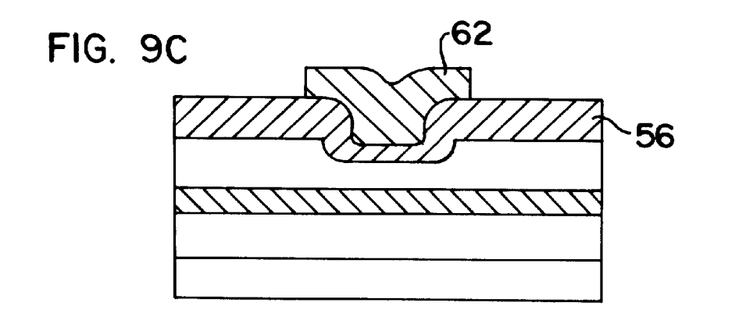

As illustrated in FIG. 9C, after removing photosensitive film 61, conductive material 56, which may be an aluminum film or an aluminum alloy film, is deposited on the overall substrate such as with a sputtering method. Photosensitive film 62 is coated on conductive material 56, which is subjected to a photoetching leaving photosensitive film 62 only over recess 54-2 as illustrated.

Figure 9D:
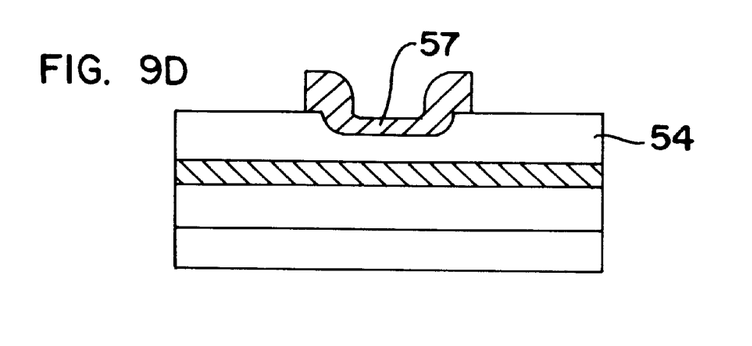

As illustrated in FIG. 9D, conductive material 56 is subjected to an etching using photosensitive film 62 as a mask.

Figure 9E:
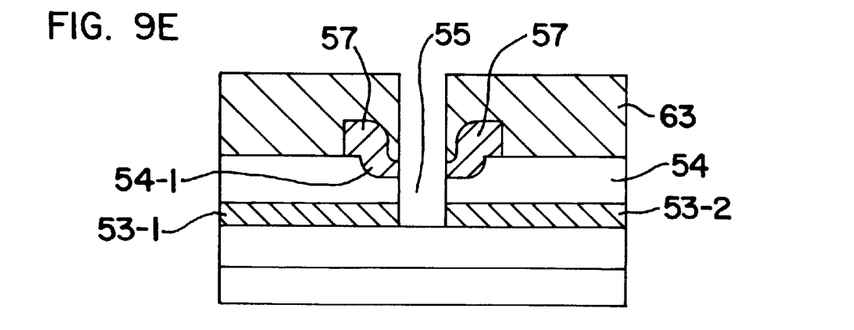

As illustrated in FIG. 9E, the remaining portions of photosensitive film 62 are removed, on which another photosensitive film 63 is coated, which is subjected to a photoetching, removing photosensitive film 63 at the portion where a contact hole is to be formed, and exposing conductive material 56 at the portion where a contact hole is to be formed.

Exposed conductive material 56 is subjected an etching using photosensitive film 63 as a mask forming conductive link 57 at the corners of recess 54-2. Exposed second insulation film 54 is subjected to an etching in the same way as with the second embodiment using photosensitive film 63 as a mask, forming contact hole 55. Upon further etching of exposed conductive material 53, two separated conductors 53-1 and 53-2 may be formed.

Conductive link 57 is formed on the corners of recess 54-1 of second insulation film 54 at the edges adjoining contact hole 55, just over two opposing edges of conductive material 53-1 and 53-2.

Figure 9F:
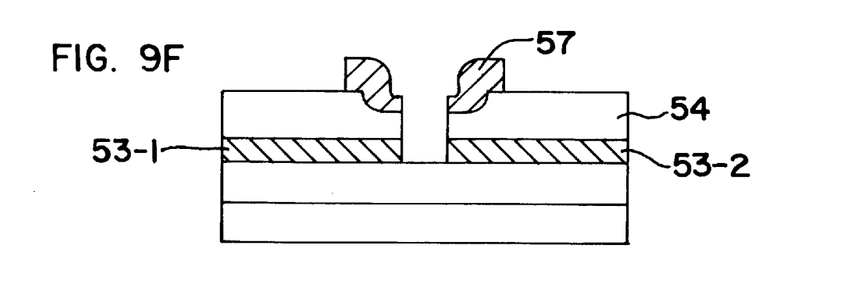
Figure 9G:
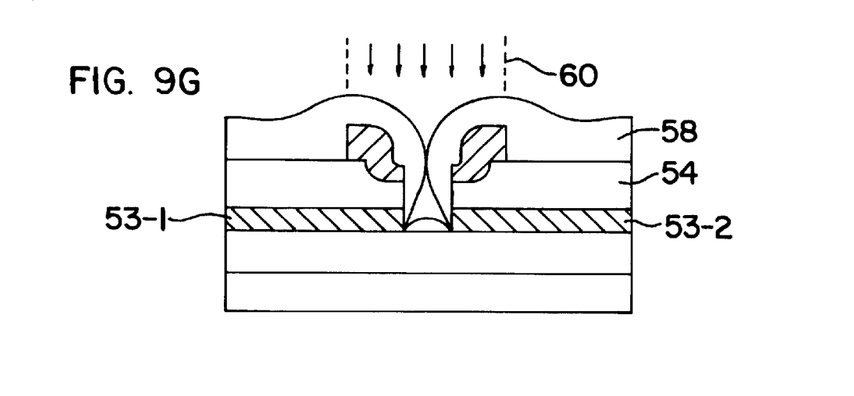
Figure 9H:
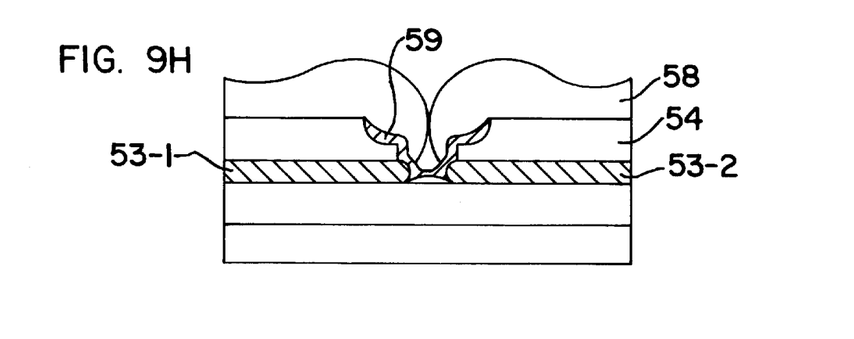

FIGS. 9F to 9H are the same as with the second embodiment illustrated in FIGS. 8G to 8H.

As has been explained, this invention can provide a capping insulation film having a minimum thickness at the sides of a contact hole due to, for example, a chemical vapor deposition characteristic of an insulation film, by forming a conductive link metal on an upper part of the contact hole containing two conductors, and a insulation film capped thereon.

Therefore, because a thin insulation film can be broken at first by compression stress induced in a link metal even with a small powered laser, which can make the linkage metal connect two conductors more uniformly, contact resistance between the linkage metal and both of the conductors as well as damages to surrounding regions by the laser can be reduced, whereby the reliability of an element can be improved.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A programmable semiconductor element having an antifuse structure, comprising:
   a silicon substrate;
   a first insulation film on the silicon substrate;
   first and second conductors on the first insulation film, wherein the first and second conductors are spaced apart at a contact hole region;
   a second insulation film on the first insulation film and the first and second conductors, wherein the second insulation film has a contact hole at a portion corresponding to the contact hole region, wherein the second insulation film has a recess along an upper portion of the contact hole;
   a conductor link in the recess in the second insulation film; and
   a capping insulation film over the substrate and covering the conductor link.

2. The semiconductor element as claimed in claim 1, wherein the first insulation film and the second insulation film comprise oxide films.

3. The semiconductor element as claimed in claim 1, wherein the conductor link comprises portions on the second insulation film at a position over the first and second conductors and portions on the second insulation film not at a position over the first and second conductors, wherein the conductor link has an opening in a central region corresponding to the contact hole.

4. The semiconductor element as claimed in claim 3, wherein the opening of the conductor link has a width wider than the width of the contact hole.

5. The semiconductor element as claimed in claim 1, wherein the conductor link comprises a metal film.

6. The semiconductor element as claimed in claim 5, wherein the metal film comprises a material selected from the group of aluminum and aluminum alloy.

7. The semiconductor element as claimed in claim 1, wherein the first and second conductors comprise metal films.

8. The semiconductor element as claimed in claim 7, wherein the metal films comprise a material selected from the group of aluminum and aluminum alloy.

9. The semiconductor element as claimed in claim 1, wherein the contact hole has a bottom above the first insulation film, wherein the capping insulation film comprises thinned regions at sides of the contact hole towards the bottom of the contact hole.

10. The semiconductor element as claimed in claim 9, wherein the capping insulation film comprises a material selected from the group of oxide and nitride.

11. A programmable semiconductor element having an antifuse structure, comprising:
    a silicon substrate;
    a first insulation film on the silicon substrate;
    first and second conductors on the first insulation film, wherein the first and second conductors are spaced apart at a contact hole region;
    a second insulation film on the first insulation film and the first and second conductors, wherein the second insulation film has a contact hole at a portion corresponding to the contact hole region, wherein the second insulation film includes a recess adjacent to the contact hole;

a conductor link in the recess in the second insulation film; and a third insulation film over the conductor link.

12. The semiconductor element as claimed in claim 11, wherein the first insulation film and the second insulation film comprise oxide films.

13. The semiconductor element as claimed in claim 11, wherein the conductor link comprises portions on the second insulation film at a position over the first and second conductors and portions on the second insulation film not at a position over the first and second conductors, wherein the conductor link has an opening in a central region corresponding to the contact hole.

14. The semiconductor element as claimed in claim 13, wherein the opening of the conductor link has a width wider than the width of the contact hole.

15. The semiconductor element as claimed in claim 11, wherein the conductor link comprises a metal film.

16. The semiconductor element as claimed in claim 15, wherein the metal film comprises a material selected from the group of aluminum and aluminum alloy.

17. The semiconductor element as claimed in claim 11, wherein the first and second conductors comprise metal films.

18. The semiconductor element as claimed in claim 17, wherein the metal films comprise a material selected from the group of aluminum and aluminum alloy.

19. The semiconductor element as claimed in claim 11, wherein the contact hole has a bottom above the first insulation film, wherein the third insulation film comprises thinned regions at sides of the contact hole towards the bottom of the contact hole.

20. The semiconductor element as claimed in claim 19, wherein the third insulation film comprises a material selected from the group of oxide and nitride.

* * * * *